United States Patent
Tada et al.

(10) Patent No.: US 9,583,550 B2
(45) Date of Patent: Feb. 28, 2017

(54) DISPLAY DEVICE (71) Applicant: Japan Display Inc., Tokyo (JP)

(72) Inventors: Yusuke Tada, Tokyo (JP); Yuko Matsumoto, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/185,181

(22) Filed: Jun. 17, 2016

(65) Prior Publication Data

US 2016/0380040 A1 Dec. 29, 2016

(30) Foreign Application Priority Data

Jun. 24, 2015 (JP) ................................. 2015-127036

(51) Int. Cl.
*H01L 27/14* (2006.01)
*H01L 27/32* (2006.01)

(52) U.S. Cl.
CPC ................................. *H01L 27/3276* (2013.01)

(58) Field of Classification Search
None
See application file for complete search history.

(56) References Cited

U.S. PATENT DOCUMENTS

| 8,354,980 B2* | 1/2013 | Kwak | ................... H01L 27/322 313/506 |
|---|---|---|---|
| 2006/0255726 A1 | 11/2006 | Kim | |
| 2010/0097295 A1 | 4/2010 | Kwak | |
| 2010/0127273 A1 | 5/2010 | Kim | |

FOREIGN PATENT DOCUMENTS

| JP | 2006-318910 A | 11/2006 |
|---|---|---|
| JP | 2010-097925 A | 4/2010 |

* cited by examiner

*Primary Examiner* — Jack Chen
(74) *Attorney, Agent, or Firm* — Typha IP LLC (57) ABSTRACT

A display device includes a plurality of pixel electrodes, a common electrode disposed from a display area to a peripheral area continuously, a light emitting layer disposed between the plurality of pixel electrodes and the common electrode, and a plurality of auxiliary wirings electrically connecting to the common electrode and located from the display area to the peripheral area continuously. The common electrode includes overlapping areas where the common electrode is in contact with and overlaps the auxiliary wiring in the peripheral area, and includes a thick film portion in at least a portion of the overlapping areas. A thickness of the thick film portion is larger than that of an area other than the overlapping areas.

18 Claims, 13 Drawing Sheets

DISPLAY DEVICE

CROSS-REFERENCE TO RELATED APPLICATION

The present application claims priority from Japanese application JP2015-127036 filed on Jun. 24, 2015, the content of which is hereby incorporated by reference into this application.

BACKGROUND OF THE INVENTION

1. Field of the Invention

The present invention relates to a display device.

2. Description of the Related Art

In a sheet-like, planar display device, a self-luminous element layer (a light emitting layer) intervenes between a pixel electrode and a common electrode, and the self-luminous element layer emits light in response to a current flowing between the pixel electrode and the common electrode. Here, when, for example, the electrical resistance of the common electrode disposed across a plurality of pixels is large, shading (luminance gradient) occurs due to a voltage drop in a display area where an image is displayed. For this reason, it is desired to reduce the electrical resistance of the common electrode.

JP 2010-097925 A discloses a display device in which a spacer is provided on a bank layer disposed between pixels, and a common electrode and an auxiliary wiring are stacked on the spacer to thereby prevent a voltage drop of the common electrode.

Moreover, JP 2006-318910 A discloses a display device in which a plurality of auxiliary wirings linearly extending over a display area and a peripheral area are disposed so as to be parallel to each other.

SUMMARY OF THE INVENTION

The overall combined resistance (i.e., sheet resistance) of a layer composed of a common electrode and an auxiliary wiring electrically connecting to the common electrode depends on the cross-sectional area of the auxiliary wiring. More specifically, by increasing the cross-sectional area of the auxiliary wiring, the sheet resistance of the common electrode and the auxiliary wiring is reduced. However, higher precision of a display device is demanded in recent years, which makes it difficult to secure a large area where the auxiliary wiring is to be formed. That is, it is difficult to form a large width of the auxiliary wiring and provide a large cross-sectional area of the auxiliary wiring.

It is an object of the invention to prevent shading in a display area.

A display device according to an aspect of the invention includes: a display area; a peripheral area located outside the display area; a plurality of pixels disposed in the display area; a plurality of pixel electrodes each disposed in each of the plurality of pixels; a common electrode covering the plurality of pixels and disposed from the display area to the peripheral area continuously; a light emitting layer disposed between at least one of the pixel electrodes and the common electrode; and a plurality of auxiliary wirings having conductivity higher than that of the common electrode, electrically connecting to the common electrode, and located from the display area to the peripheral area continuously, wherein the common electrode includes an overlapping area where the common electrode is in contact with and overlaps the plurality of auxiliary wirings in the peripheral area, the common electrode includes a thick film portion in at least a portion of the overlapping areas, and a thickness of the thick film portion is larger than that of an area other than the overlapping areas. According to this, shading in the display area can be prevented.

DETAILED DESCRIPTION OF THE INVENTION

Some modes (hereinafter referred to as "embodiments") for implementing the invention will be described below. The disclosure of the specification is merely an example of the invention. Appropriate modifications that fall within the spirit of the invention and will readily occur to those skilled in the art are included in the scope of the invention. The width, thickness, shape, and the like of each part shown in the drawings are schematically represented, and do not limit the interpretation of the invention.

1. First Embodiment

Figure 1:
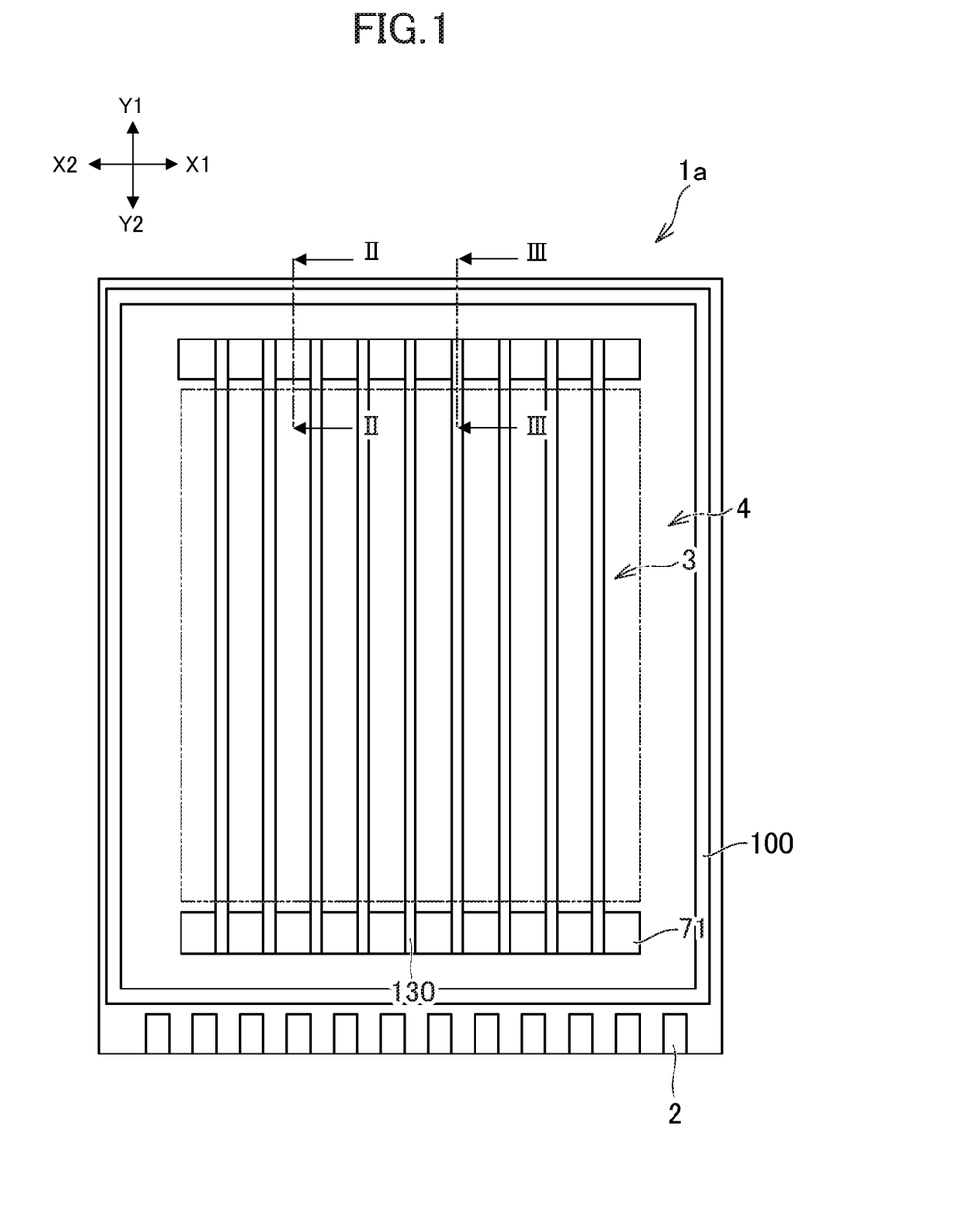
FIG. 1 is a plan view schematically showing a display device according to a first embodiment.

First, a display device 1a according to a first embodiment will be described. FIG. 1 is a plan view schematically showing the display device 1a according to the first embodiment. As shown in FIG. 1, a display area 3 where an image is displayed and a peripheral area 4 surrounding the display area 3 on the outside thereof are formed on one surface of the display device 1a.

The display device 1a displays an image in the display area 3 in response to image signals received through publicly known various devices. More specifically, a plurality of terminals 2 made of a conductive material such as metal are formed in the display device 1a, and the display device 1a accepts the image signal through each of the plurality of terminals 2 to thereby display an image in the display area 3.

Figure 2:
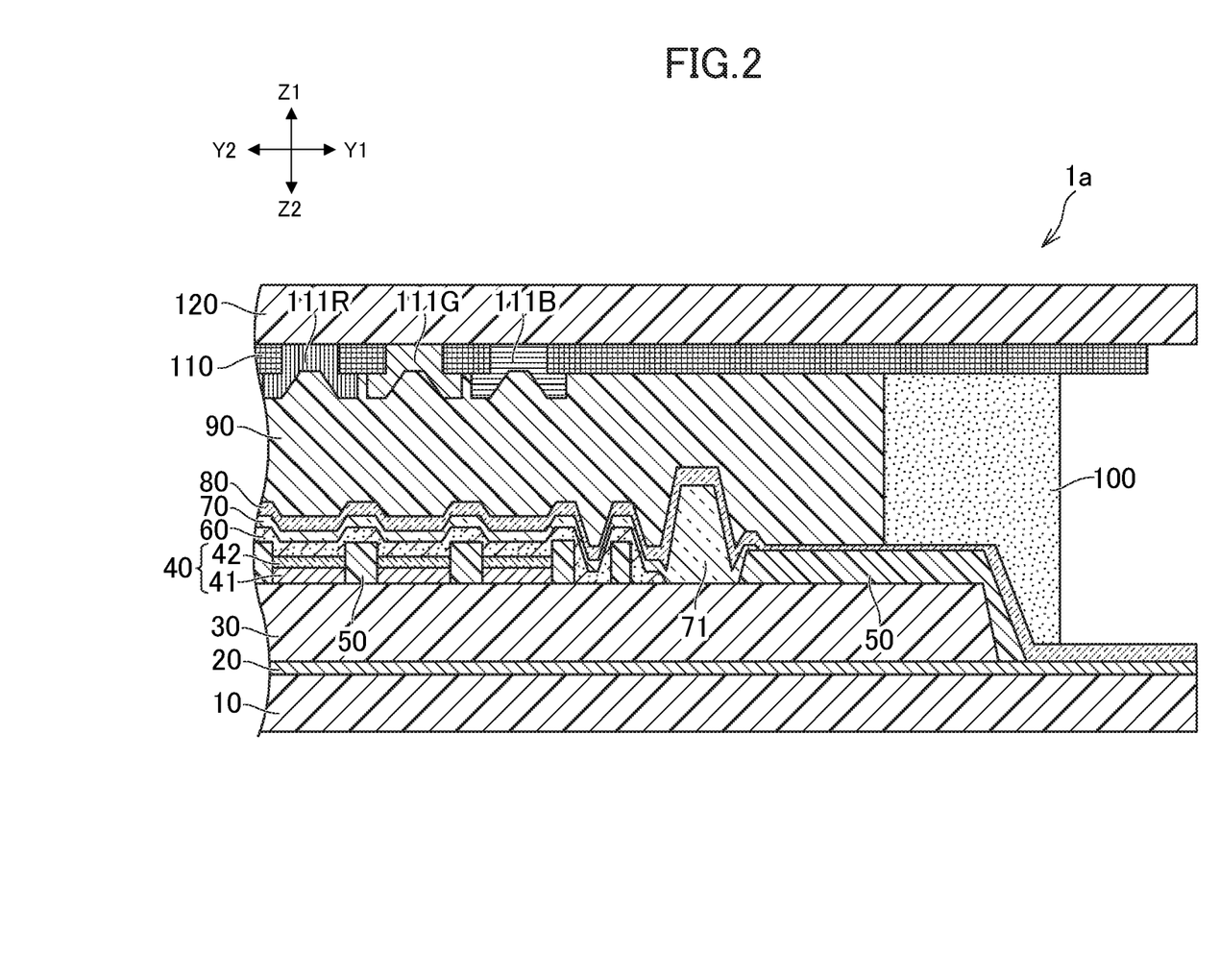
FIG. 2 is a cross-sectional view schematically showing a configuration of the display device according to the first embodiment.

FIG. 2 is a cross-sectional view schematically showing a configuration of the display device 1a, taken at the cutting plane indicated by the line II-II in FIG. 1. As shown in FIG. 2, the display device 1a includes a first substrate 10. The first substrate 10 is composed of a glass substrate or a substrate including a resin layer such as polyimide and having flexibility (a resin substrate or a film substrate). A circuit layer 20 into which a plurality of driver circuits (not shown) are incorporated is formed on the first substrate 10.

An insulating layer 30 formed of an insulating material such as resin and a plurality of pixel electrodes 40 are stacked on the circuit layer 20. The insulating layer 30 is, for example, an organic planarization film or organic passivation film formed on thin film transistors (not shown) included in the circuit layer 20. Each of the plurality of pixel electrodes 40 is configured to include a first pixel electrode 41 formed of a light-reflecting conductive material such as metal (e.g., silver) and a second pixel electrode 42 formed of a transparent conductive material such as indium tin oxide (ITO) or indium zinc oxide (IZO).

A bank layer 50 formed of an insulating material such as resin is stacked on the insulating layer 30. The bank layer 50 prevents a short circuit between each of the plurality of pixel electrodes 40 and a common electrode 70 described later. Moreover, the bank layer 50 is disposed so as to surround the perimeter of each of a plurality of pixels constituting an image in the display area 3 (see FIG. 1). The plurality of pixel electrodes 40 are provided in the display area 3 and respectively correspond to the plurality of pixels. More specifically, the plurality of pixel electrodes 40 are disposed independently for each of the pixels by means of the bank layer 50 and also electrically isolated from each other.

A self-luminous element layer 60 (a light emitting layer) and the common electrode 70 are formed so as to cover the surface under which the plurality of pixel electrodes 40 and the bank layer 50 are formed. The common electrode 70 is formed of a material having a light-transmitting property and conductivity such as ITO or IZO. The common electrode 70 is disposed so as to cover the plurality of pixels and disposed from the display area 3 over the peripheral area 4 (see FIG. 1). The self-luminous element layer 60 intervenes between the plurality of pixel electrodes 40 and the common electrode 70. The self-luminous element layer 60 emits light in response to a current flowing between the pixel electrode 40 and the common electrode 70 through the self-luminous element layer 60, and the luminance of the light is controlled by the amount of current flowing between the electrodes. As the self-luminous element layer 60, for example, an organic layer made of an organic compound is used. The circuit layer 20 includes the plurality of driver circuits for controlling the current flowing between each of the plurality of pixel electrodes 40 and the common electrode 70. Each of the plurality of pixel electrodes 40 is electrically coupled to the driver circuit corresponding thereto. The display device 1a according to the embodiment adopts a top-emission type organic EL display device, which is configured to emit the light emitted by the self-luminous element layer 60 to the upper side (the Z1 side in FIG. 2) of the display device 1a.

A sealing layer 80 is formed so as to cover the surface under which the common electrode 70 and the bank layer 50 are formed. The sealing layer 80 is formed of, for example, an inorganic material such as SiOx or SiNy; however, the sealing layer is not limited to this as long as the material has light transparency. The sealing layer 80 prevents the entry of oxygen or moisture into the self-luminous element layer 60.

A second substrate 120 is disposed to face the first substrate 10. A color filter layer is formed on the second substrate 120. As shown in FIG. 2, the color filter layer is composed of color filters 111R, 111G, and 111B that transmit light in predetermined colors for each of the plurality of pixels. More specifically, the color filter layer is composed of the color filter 111R transmitting red light, the color filter 111G transmitting green light, and the color filter 111B transmitting blue light. A light-shielding film 110 is disposed at boundary portions of the color filters 111R, 111G, and 111B and in an area from the edge portion of the color filter 111B to the peripheral area.

A filling layer 90 is formed on the sealing layer 80 between the first substrate 10 and the second substrate 120. The filling layer 90 is formed by, for example, flowing a transparent filling material into a place surrounded by a sealing material 100 that functions as a dam.

In FIG. 2, the sealing material 100 is disposed in contact with the sealing layer 80 and the light-shielding film 110. Further, the edge portion of the insulating layer 30 is located in an area where the edge portion overlaps the sealing material 100. However, the structures are not limited to these structures. For example, a structure may be employed in which the edge portion of the insulating layer 30 is disposed inside the sealing material 100.

As shown in FIG. 1, a plurality of auxiliary wirings 130 are linearly disposed in the display device 1a. Each of the plurality of auxiliary wirings 130 passes between the pixels next to each other and is disposed from the display area 3 over the peripheral area 4. Both ends of each of the plurality of auxiliary wirings 130 are located in the peripheral area 4. In the embodiment, each of the plurality of auxiliary wirings 130 extends in the vertical direction (i.e., the Y-axis direction in FIG. 1).

Figure 3:
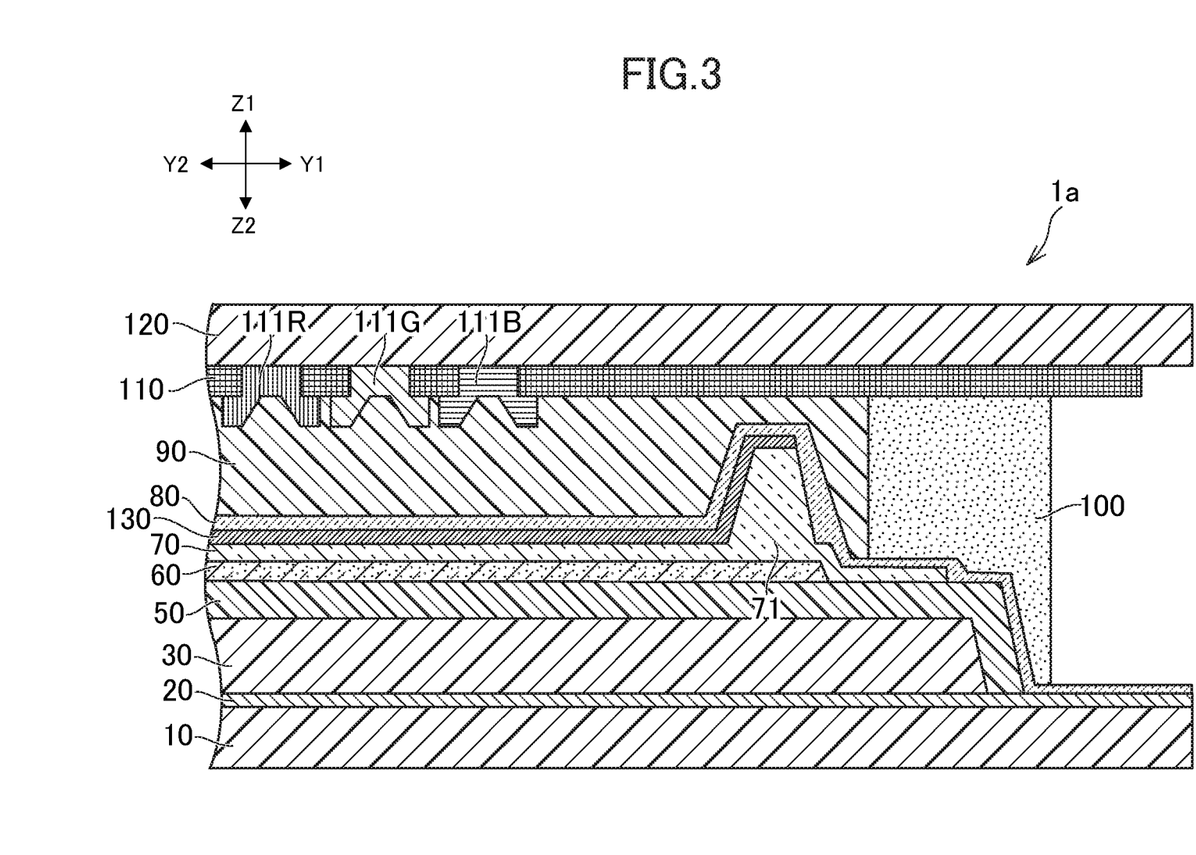
FIG. 3 is a cross-sectional view schematically showing the configuration of the display device according to the first embodiment.

FIG. 3 is a cross-sectional view schematically showing a configuration of the display device 1a, taken at the cutting plane indicated by the line III-III (i.e., a line along a direction in which the auxiliary wiring 130 extends) in FIG. 1. As shown in FIG. 3, the auxiliary wiring 130 is formed on the common electrode 70 and in contact with the common electrode 70 so as to electrically connect thereto. Here, the auxiliary wiring 130 is formed of a material having conductivity higher than that of the common electrode 70. The auxiliary wiring 130 is formed of, for example, metal such as silver.

By providing the auxiliary wiring 130 connected with the common electrode 70 as described above, the overall combined resistance (i.e., sheet resistance) of a layer composed of the common electrode 70 and the auxiliary wiring 130 becomes smaller than the sheet resistance of the common electrode 70 alone. However, an electrical resistance (i.e., contact resistance) occurs at an interface (hereinafter also referred to as "contact interface") where the common electrode 70 and the auxiliary wiring 130 contact each other. In order to further reduce the sheet resistance of the common electrode 70 and the auxiliary wiring 130 to prevent shading in the display area 3, it is desired to reduce the contact resistance at the contact interface.

The contact resistance between the common electrode 70 and the auxiliary wiring 130 can be measured by a publicly known transfer length method (TLM). More specifically, when the thickness of the common electrode 70 at the contact interface between the common electrode 70 and the auxiliary wiring 130 is increased, a current flowing area is widened at the contact interface where the common electrode 70 and the auxiliary wiring 130 contact each other, and therefore, the contact resistance at the contact interface is reduced. However, since the common electrode 70 is disposed so as to cover substantially the entire area of the display area 3, the transmittance of light in the display area 3 is reduced when the thickness of the common electrode 70 is simply increased over the entire area thereof, and thus the efficiency of extracting light of the pixel is reduced.

In the embodiment, therefore, a portion where the thickness of the common electrode 70 is thicker than that of the other area is provided in at least a portion of an overlapping area where the common electrode 70 and the auxiliary wiring 130 overlap in the peripheral area 4. More specifically, as shown in FIGS. 1 and 3, a thick film portion 71 is formed in at least a portion of the overlapping area in the peripheral area 4, so as to overlap each of the both ends of the auxiliary wiring 130 and be in contact with the auxiliary wiring 130. As shown in FIGS. 1 and 2, the thick film portion 71 is provided to extend in a direction in which the plurality of auxiliary wirings 130 are arranged (the X-axis direction in FIG. 1). That is, the thick film portion 71 overlaps the plurality of auxiliary wirings 130 adjacent to each other. It is needless to say that the thick film portion 71 and the auxiliary wiring 130 are electrically connected at a portion where the thick film portion 71 and the auxiliary wiring 130 contact each other. Since it is better for the auxiliary wiring 130 and the thick film portion 71 to have a larger contact area, it is desired for the auxiliary wiring 130, as shown in FIGS. 1 and 3, to extend from the display area 3 through the upper surface of the thick film portion 71 to the edge portion of the upper surface on the side opposite to the display area. Further, the auxiliary wiring 130 may extend until the auxiliary wiring 130 contacts the side surface of the thick film portion 71 on the side opposite to the display area as in FIG. 9 described later.

By forming the thick film portion 71 in the peripheral area 4 as described above, the contact resistance between the common electrode 70 and the auxiliary wiring 130 can be lowered without impairing a light transmittance in the display area 3. By doing so, since a current easily flows in the thick film portion 71 of the common electrode 70, the overall sheet resistance of the common electrode 70 and the auxiliary wiring 130 can be lowered. That is, shading can be prevented without lowering the light transmittance in the display area 3. The thick film portion 71 can be formed by, after forming the common electrode 70, additionally depositing a transparent conductive material (the same material as the common electrode 70 may suffice) at a predetermined place where the thick film portion 71 is to be disposed.

2. Second Embodiment

Figure 4:
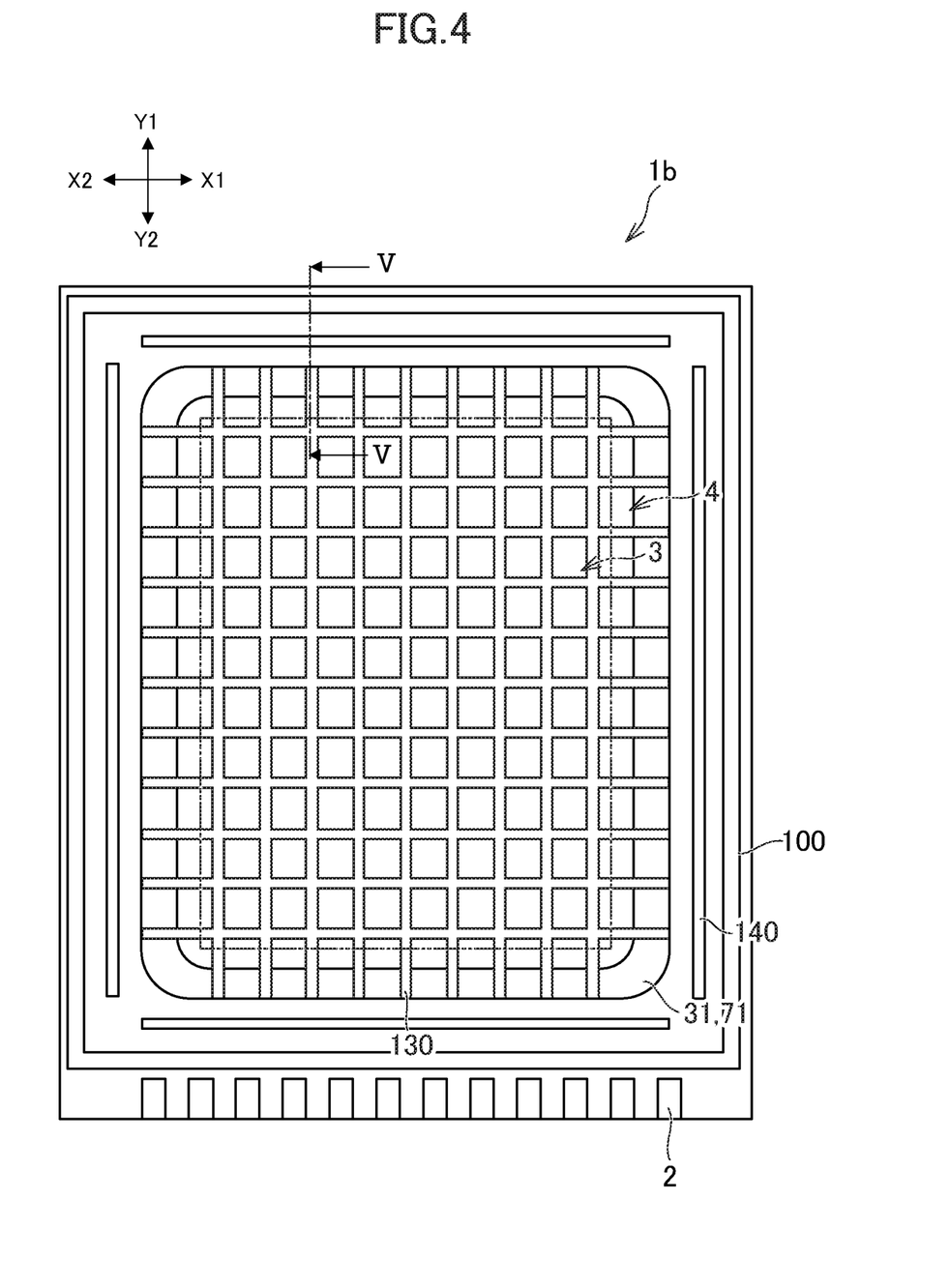
FIG. 4 is a plan view schematically showing a display device according to a second embodiment.

Next, a display device 1b according to a second embodiment will be described. FIG. 4 is a plan view schematically showing the display device 1b according to the second embodiment. In the display device 1b according to the embodiment, the plurality of auxiliary wirings 130 extend in each of the vertical and horizontal directions intersecting each other (a first direction and a second direction intersecting the first direction), unlike the display device 1a according to the first embodiment. The thick film portion 71 of the display device 1b according to the embodiment is continuously provided so as to annularly surround the display area 3.

Here, also by widening the contact interface between the common electrode 70 and the auxiliary wiring 130, the contact resistance at the contact interface therebetween is reduced. For this reason, by extending the auxiliary wiring 130 also in the horizontal direction as in the embodiment and widening the contact interface at which the auxiliary wiring 130 contacts the common electrode 70, the contact resistance between the common electrode 70 and the auxiliary wiring 130 can be further reduced. Moreover, since the auxiliary wirings 130 extend in both the vertical and horizontal directions, the sheet resistance of the common electrode 70 and the auxiliary wiring 130 can be made uniform in both the vertical and horizontal directions.

Figure 5:
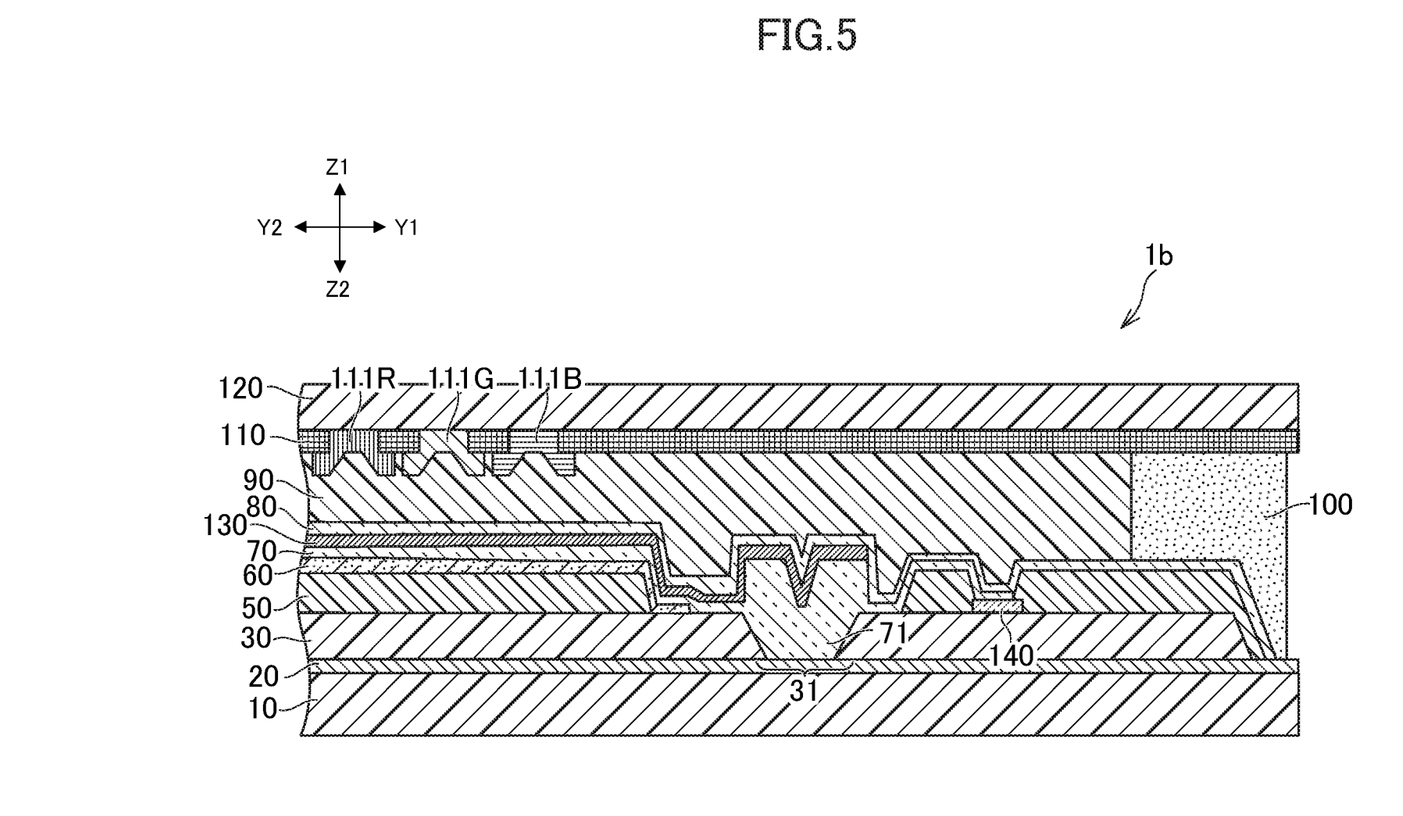
FIG. 5 is a cross-sectional view schematically showing a configuration of the display device according to the second embodiment.

FIG. 5 is a cross-sectional view schematically showing a configuration of the display device 1b, taken at the cutting plane indicated by the line V-V in FIG. 4. FIG. 5 is a diagram corresponding to FIG. 3 in the first embodiment. As shown in FIGS. 4 and 5, the display device 1b according to the embodiment further includes, in the peripheral area 4, contact wirings 140 electrically connecting to the common electrode 70 and the plurality of auxiliary wirings 130. The contact wiring 140 is formed of, for example, a metal material such as silver. In the embodiment, the common electrode 70 is in contact with the contact wiring 140 in a contact hole formed in the bank layer 50, and the auxiliary wiring 130 is electrically connected with the contact wiring 140 through the common electrode 70. Here, a predetermined potential (e.g., reference potential) is supplied to the common electrode 70 through the contact wiring 140.

In the display device 1b, the insulating layer 30 includes a groove 31 in the peripheral area 4. In a portion where the groove 31 is formed, the bank layer 50 and the insulating layer 30, that is, organic layers are removed therefrom. The insulating layer 30 is separated by the groove 31 into an area including the display area 3 and inside the groove 31 and an area outside the groove 31. As shown in FIG. 5, the groove 31 is continuously provided annularly so as to surround the display area 3. In the embodiment, the thick film portion 71 of the common electrode 70 is located so as to be filled in the groove 31. Moreover, in the embodiment, the contact wiring 140 is provided in the area outside the groove 31 of the insulating layer 30.

By providing the groove 31 in the insulating layer 30 as described above, moisture entering the insulating layer 30 from the outside of the display device 1b is blocked by the groove 31, which makes it possible to prevent the entry of moisture into the pixel electrode 40 or the self-luminous element layer 60 disposed in the display area 3. Moreover, by forming the thick film portion 71 in the portion of the groove 31 (i.e., a portion where the insulating layer 30 is not formed) so as to be filled in the groove 31, it is not necessary to dispose the thick film portion 71 on the insulating layer 30. When considering mass productivity such as variations in manufacture, a gap between a facing surface (the sealing layer 80) on the first substrate 10 side and a facing surface (the light-shielding film 110) on the second substrate 120 side cannot be reduced unlimitedly and needs to be of a predetermined size or more. When the thick film portion 71 is disposed on the insulating layer 30, a distance between the sealing layer 80 on the thick film portion 71 and the upper surface of the insulating layer 30 is increased, and further, a gap of the predetermined size or more is necessary between the sealing layer 80 on the thick film portion 71 and the facing surface on the second substrate 120 side. Accordingly, the thickness of the entire display device 1b is increased. In the embodiment, by forming the thick film portion 71 so as to be filled in the groove 31, it is not necessary to dispose the thick film portion 71 on the insulating layer 30. Therefore, the thick film portion 71 can be formed without increasing the thickness of the entire display device 1b, and the contact resistance between the common electrode 70 and the auxiliary wiring 130 can be reduced.

3. Third Embodiment

Figure 6:
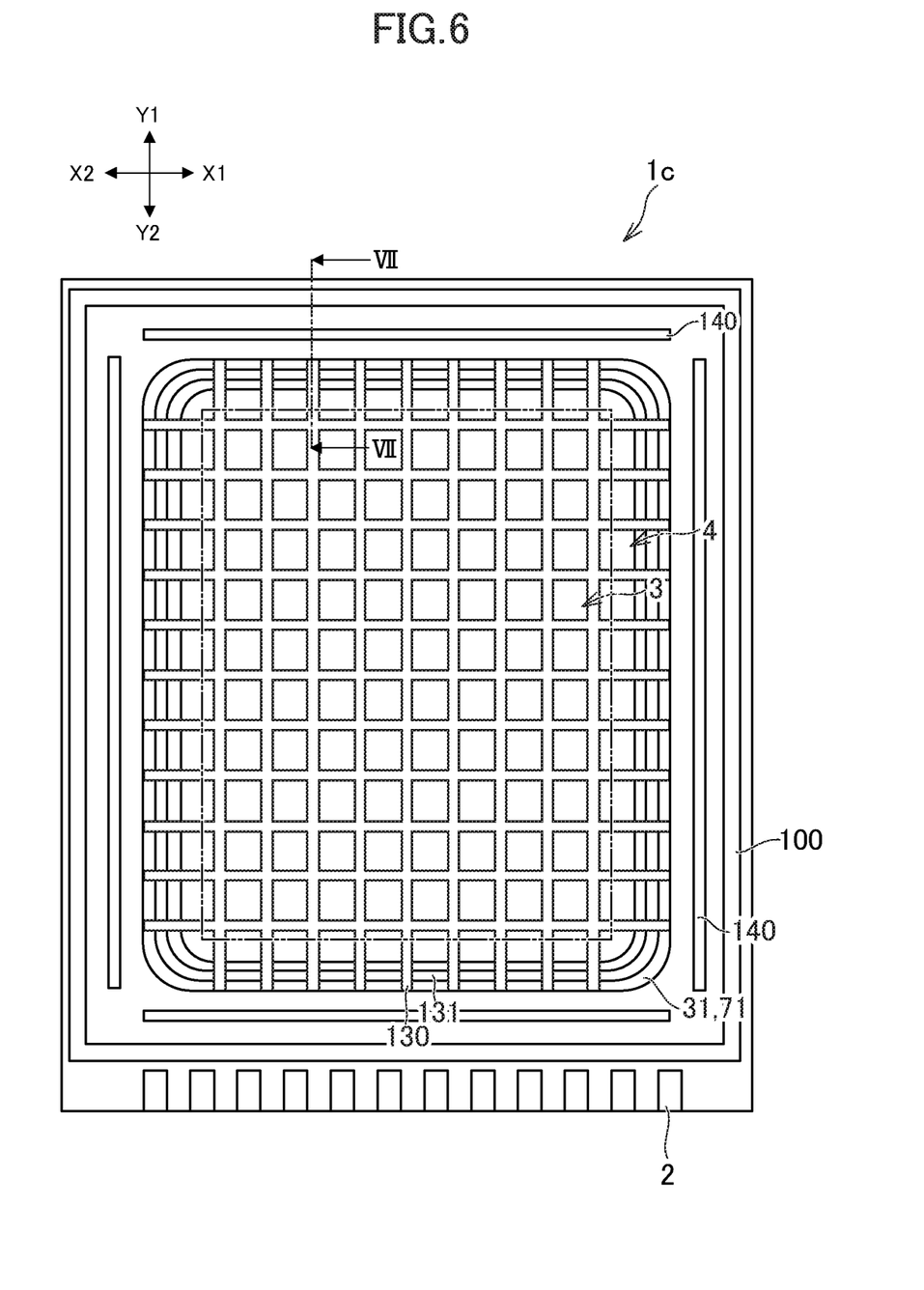
FIG. 6 is a plan view schematically showing a display device according to a third embodiment.
Figure 7:
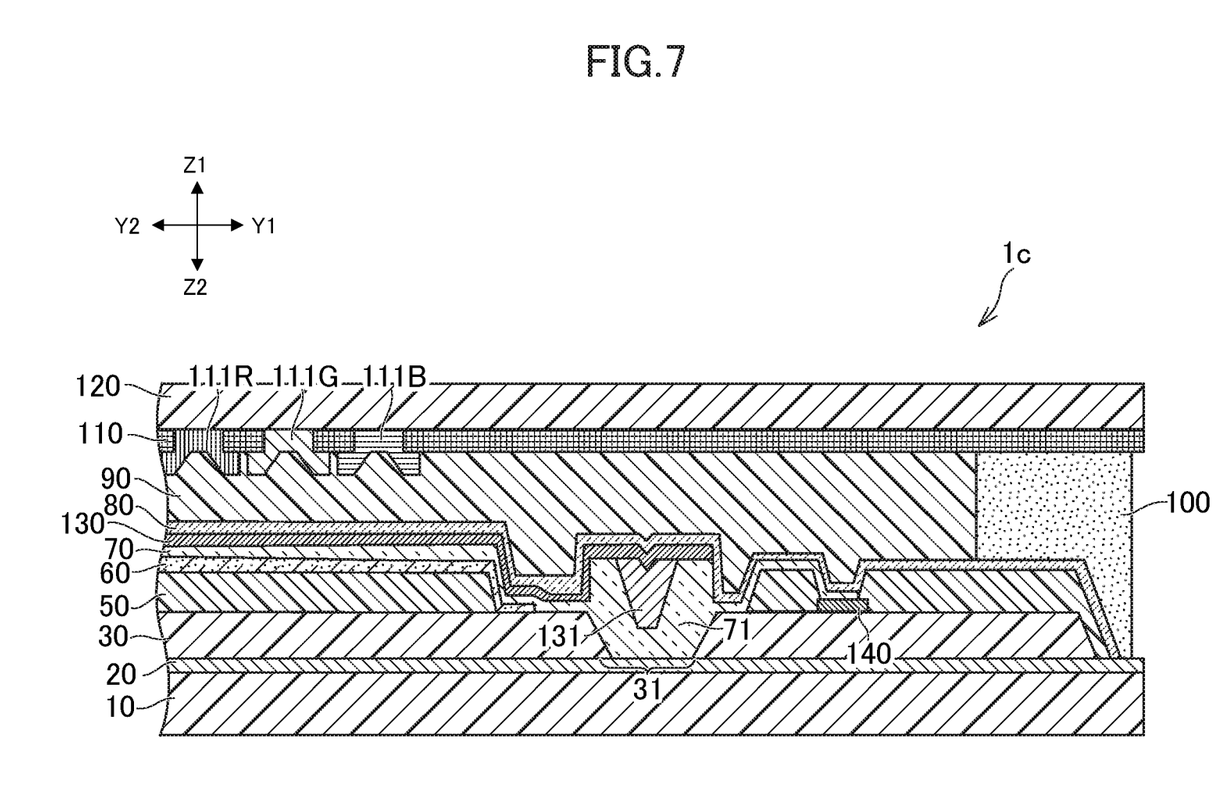
FIG. 7 is a cross-sectional view schematically showing a configuration of the display device according to the third embodiment.

Next, a display device 1c according to a third embodiment will be described. FIG. 6 is a plan view schematically showing the display device 1c according to the third embodiment. FIG. 7 is a cross-sectional view schematically showing a configuration of the display device 1c, taken at the cutting plane indicated by the line VII-VII in FIG. 6.

As shown in FIGS. 6 and 7, in the display device 1c according to the embodiment, the groove 31 and the thick film portion 71 are provided annularly so as to surround the display area 3, similarly to the display device 1b according to the second embodiment. On the other hand, unlike the display device 1b, a connection wiring 131 formed of a conductive material such as metal (e.g., silver) is provided in the display device 1c. The connection wiring 131 is disposed on the thick film portion 71 and provided annularly so as to surround the display area 3.

Moreover, as shown in FIGS. 6 and 7, the connection wiring 131 overlaps the thick film portion 71 and is in contact with the common electrode 70 and the plurality of auxiliary wirings 130 so as to electrically connect thereto. That is, the plurality of auxiliary wirings 130 are electrically connected to each other through the connection wiring 131 in the peripheral area 4. In the example shown in FIG. 7, the connection wiring 131 is provided between the thick film portion 71 and the auxiliary wiring 130; however, the connection wiring 131 is not limited to this and may be provided on the auxiliary wiring 130. Moreover, the connection wiring 131 may be formed of the same material (e.g., silver) as the auxiliary wiring 130. That is, the auxiliary wiring 130 may be formed integrally with the connection wiring 131.

As shown in FIG. 6, the connection wiring 131 and the thick film portion 71 are connected in an area between the plurality of auxiliary wirings 130. That is, by providing the connection wiring 131, the contact interface between the auxiliary wiring 130 (and the connection wiring 131) and the common electrode 70 is widened. For this reason, the contact resistance between the common electrode 70 and the auxiliary wiring 130 can be further reduced over the entire common electrode 70.

5. Modified Examples

The invention is not limited to the embodiments described above and may be variously modified. Examples of other modes (modified examples) for implementing the invention will be described below.

5-1. First Modified Example

Although an example in which the thick film portion 71 is provided in the depressed portion of the groove 31 formed in the insulating layer 30 (see FIGS. 4 and 5) has been described in the second embodiment, the place where the thick film portion 71 is provided may not be limited only to the depressed portion of the groove 31.

Figure 8:
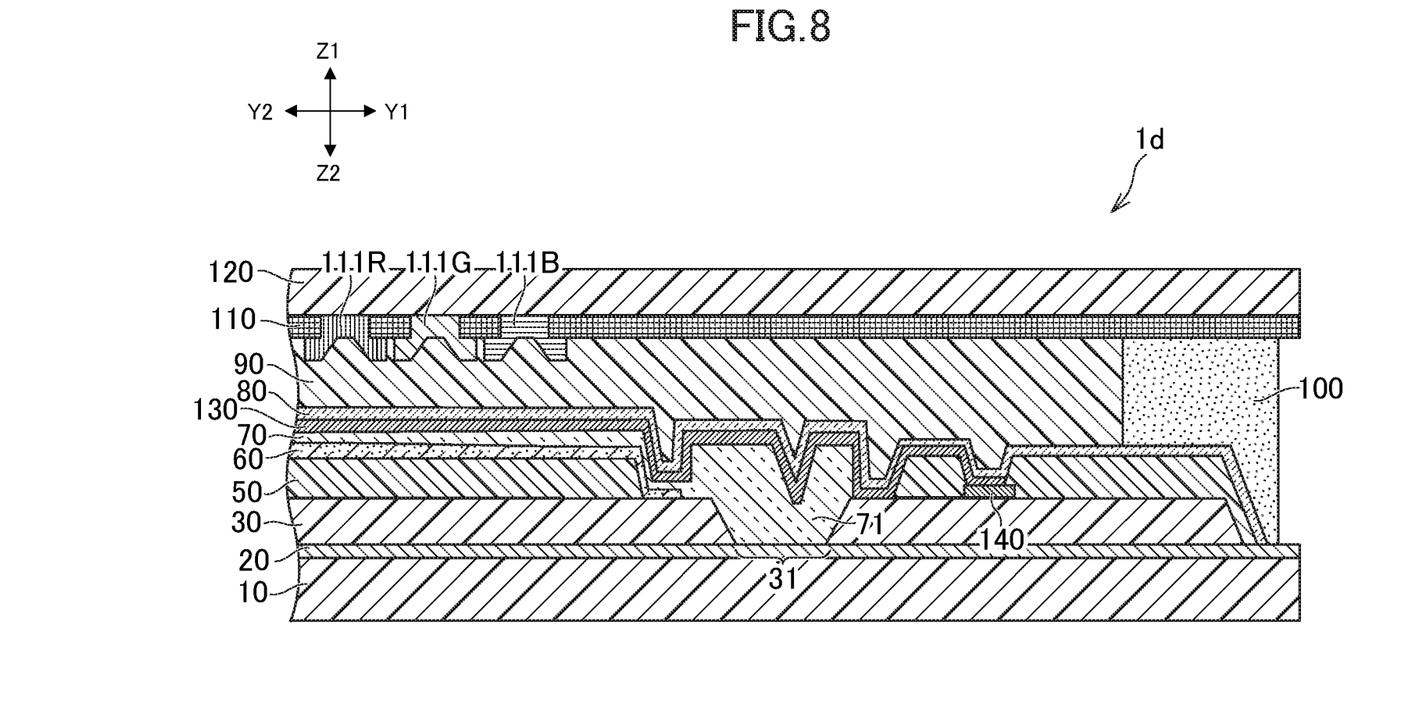
FIG. 8 is a cross-sectional view schematically showing a configuration of a display device according to a first modified example.

FIG. 8 is a cross-sectional view schematically showing a display device 1d according to a first modified example, corresponding to FIG. 5 in the second embodiment. As shown in FIG. 8, the thick film portion 71 may be provided from the depressed portion of the groove 31 to the upper surface of the insulating layer 30. By doing this, the contact interface between the thick film portion 71 and the auxiliary wiring 130 can be widened, which makes it possible to further reduce the contact resistance between the thick film portion 71 and the auxiliary wiring 130.

5-2. Second Modified Example

Although an example in which the contact wiring 140 is provided in the peripheral area 4 so as to be in contact with the common electrode 70 (see FIGS. 4 and 5) has been described in the second embodiment, not the common electrode 70 but the auxiliary wiring 130 may be in direct contact with the contact wiring 140.

Figure 9:
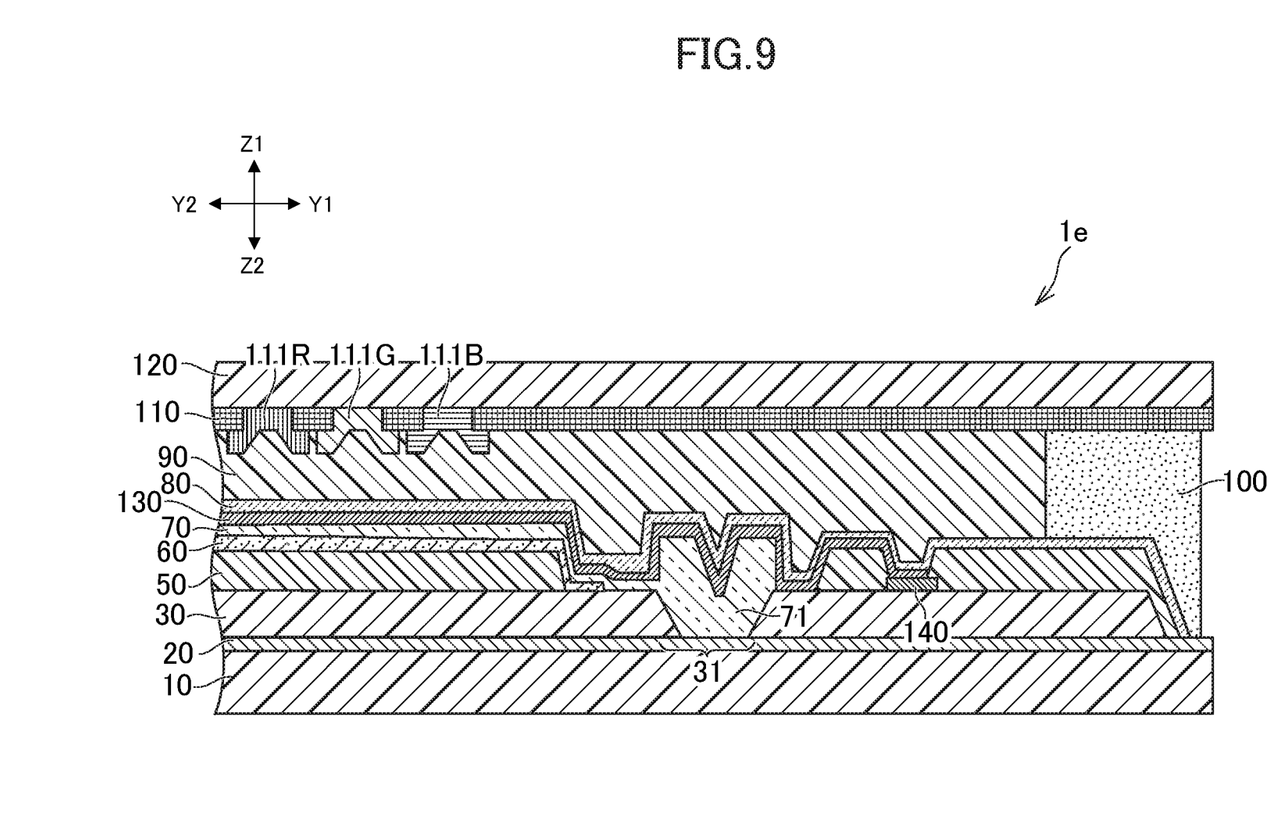
FIG. 9 is a cross-sectional view schematically showing a configuration of a display device according to a second modified example.

FIG. 9 is a cross-sectional view schematically showing a display device 1e according to a second modified example, corresponding to FIG. 5 in the second embodiment. As shown in FIG. 9, the plurality of auxiliary wirings 130 may be in direct contact and electrically connected with the contact wiring 140. In this case, the common electrode 70 may be provided while avoiding the contact wiring 140. Even with this configuration, since the common electrode 70 is in contact with the plurality of auxiliary wirings 130, the common electrode 70 and the contact wiring 140 can be electrically connected. Moreover, by providing a place where the contact wiring 140 and the auxiliary wiring 130 are indirect contact with each other, the resistance when the common electrode 70, the auxiliary wiring 130, and the contact wiring 140 are perceived as one body can be reduced.

5-3. Third Modified Example

Figure 10:
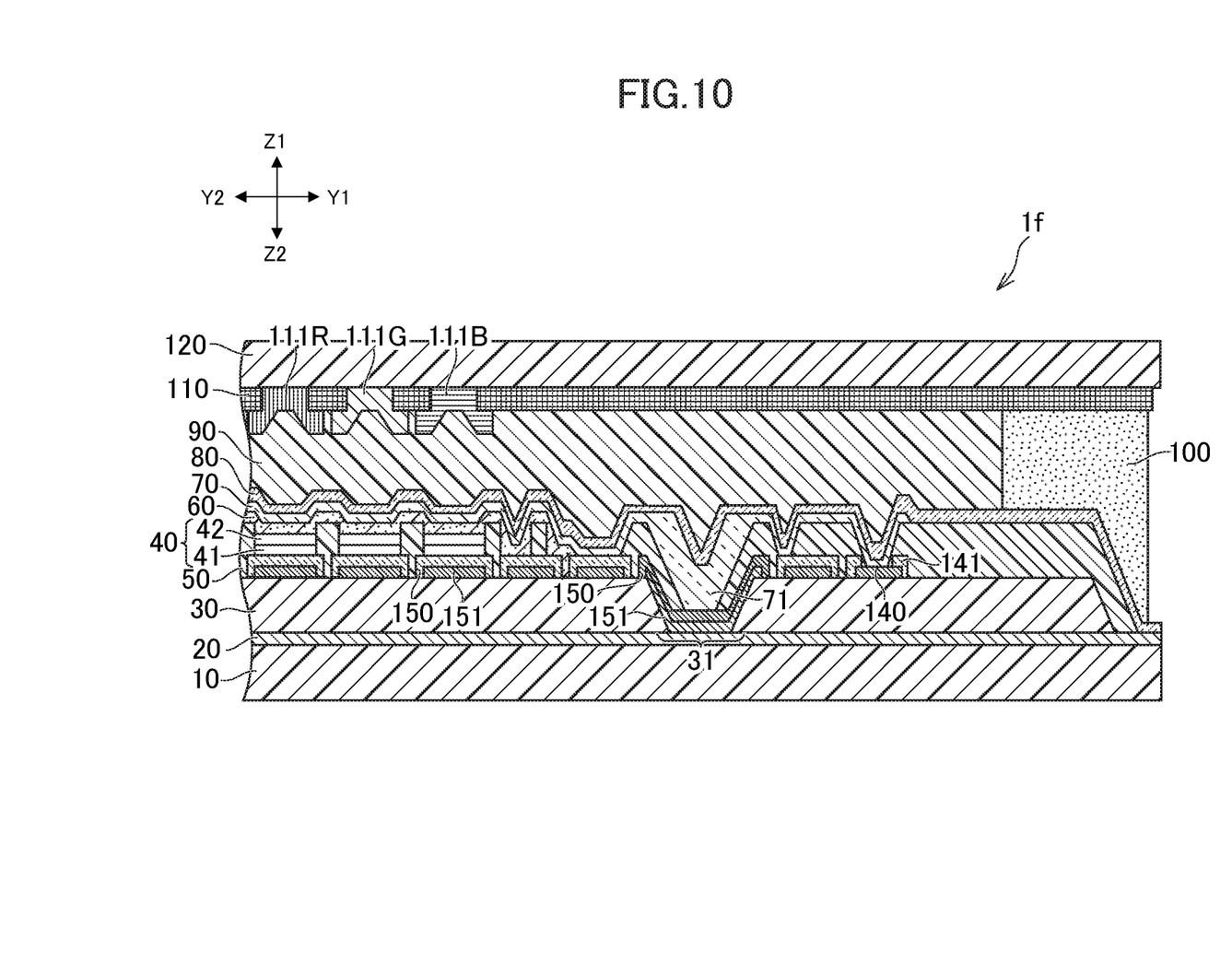
FIG. 10 is a cross-sectional view schematically showing a configuration of a display device according to a third modified example.
Figure 11:
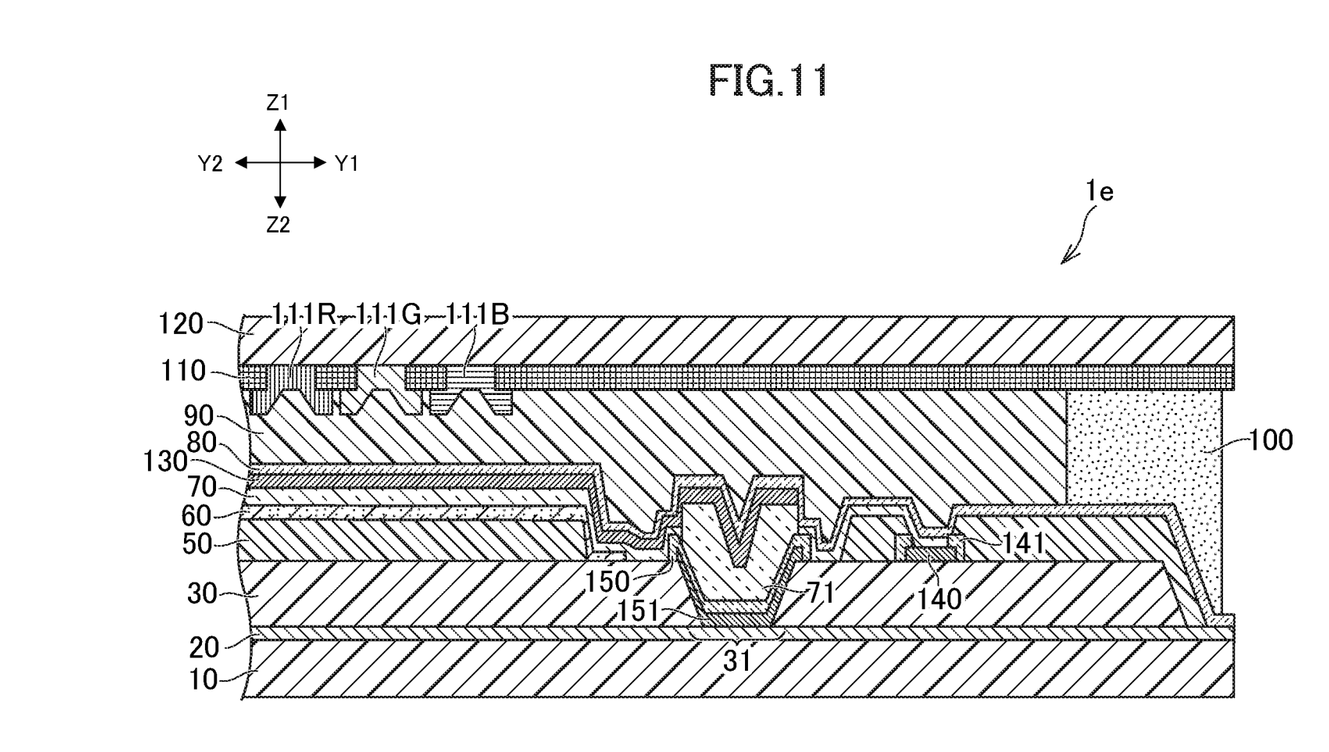
FIG. 11 is a cross-sectional view schematically showing the configuration of the display device according to the third modified example.

FIGS. 10 and 11 are cross-sectional views schematically showing a display device 1f according to a third modified example as a modified example of the second embodiment. FIG. 10 is a cross-sectional view at a position not overlapping the auxiliary wiring 130. FIG. 11 corresponds to FIG. 5 in the second embodiment. As shown in FIGS. 10 and 11, an insulating film 150 and a metal layer 151 may be provided so as to be stacked on the side (the lower side (i.e., the Z2-direction side of the pixel electrode 40) in the example of FIGS. 10 and 11) of the pixel electrode 40 opposite to the self-luminous element layer 60. Then, a storage capacitor may be configured by stacking each of the plurality of pixel electrodes 40, the insulating film 150, and the metal layer 151 as described above. By doing this, it is possible to provide the storage capacitor for each of a plurality of image circuits electrically connecting respectively to the plurality of pixel electrodes 40.

The insulating film 150 and the metal layer 151 maybe stacked also on the lower side (i.e., the place where the groove 31 is formed) of the thick film portion 71. Moreover, any of a plurality of the metal layers 151 to be formed may be used as the contact wiring 140. In this case, by providing an opening in an insulating film 141 (the same layer as the insulating film 150) covering the contact wiring 140, the contact wiring 140 and the common electrode 70 (or the auxiliary wiring 130) may be in contact with each other.

5-4. Fourth Modified Example

Although an example in which the insulating layer 30 includes the groove 31 in the peripheral area 4 and the contact wiring 140 is formed outside the groove 31 (see FIG. 5) has been described in the second embodiment, the positional relationship between the groove 31 and the contact wiring 140 is not limited to this.

Figure 12:
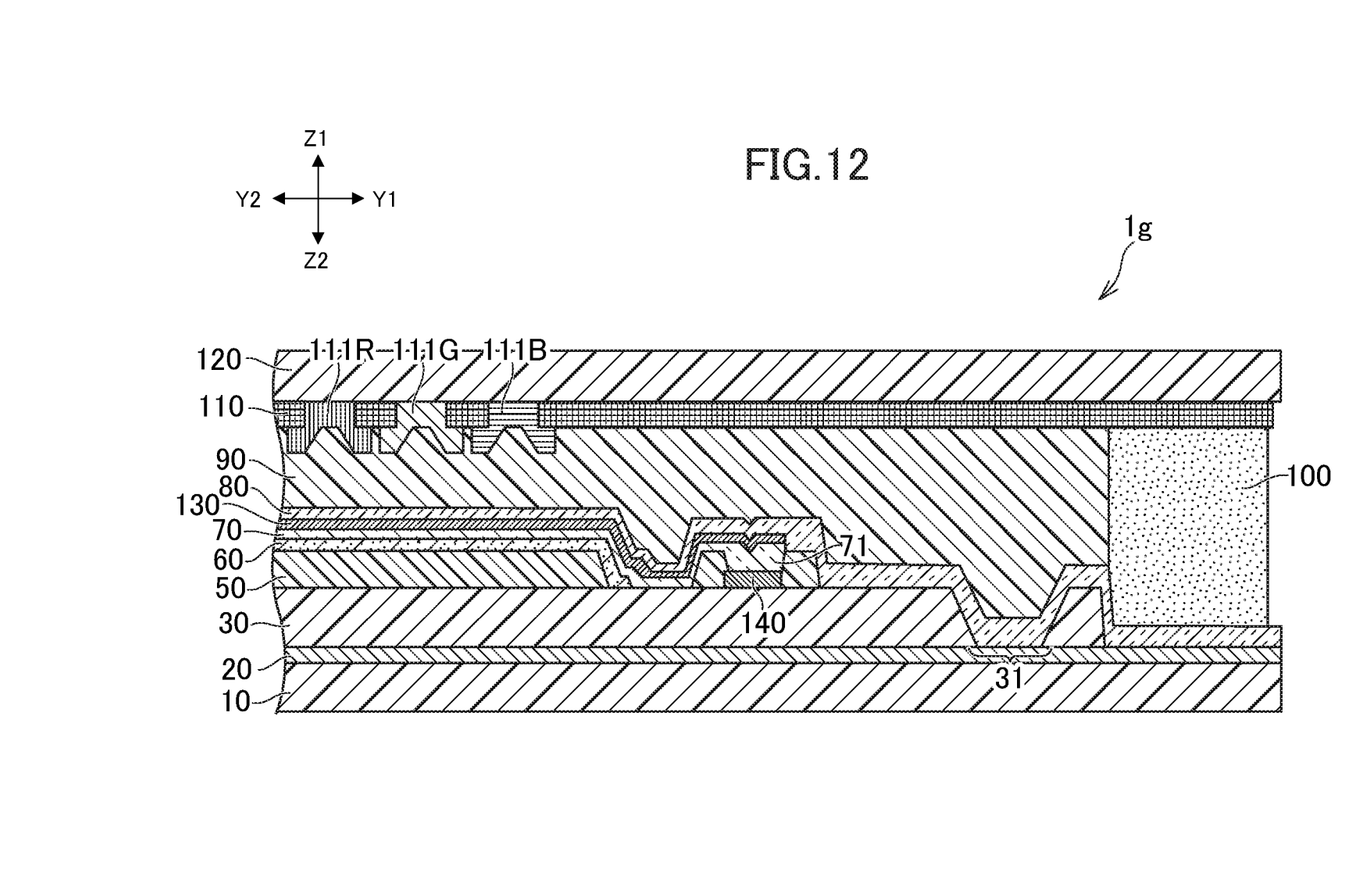
FIG. 12 is a cross-sectional view schematically showing a configuration of a display device according to a fourth modified example.

FIG. 12 is a cross-sectional view schematically showing a display device 1g according to a fourth modified example, corresponding to FIG. 5 in the second embodiment. As shown in FIG. 12, the contact wiring 140 may be provided in an area including the display area 3 thereinside and separated by the groove 31, that is, on the display area 3 side of the groove 31.

Moreover, as shown in FIG. 12, the thick film portion 71 may be disposed on the contact wiring 140. By doing this, since the thickness of the common electrode 70 in contact with the contact wiring 140 can be secured, it is possible to reduce, not only the contact resistance between the common electrode 70 and the auxiliary wiring 130, but also the contact resistance between the common electrode 70 and the contact wiring 140. Further, by forming the thick film portion 71 on a portion where the insulating layer 30 is not formed, the thickness of the thick film portion 71 can be increased without increasing the thickness of the entire display device 1g. Although not shown in the drawing, the insulating layer 30 may not necessarily include the groove 31 in the display device 1g.

In the structure in which the groove 31 is not formed in the display device 1g according to the fourth modified example, a structure may be employed in which a portion of the contact wiring 140 exposed from the insulating layer 30 and the auxiliary wiring 130 may be in direct contact with each other.

In FIG. 12, the structure is such that the insulating layer 30 and the bank layer 50 do not overlap the sealing material 100 as viewed planarly. However, a structure may be employed in which the insulating layer 30 and the bank layer 50 overlap the sealing material 100 as shown in FIG. 2. Moreover, the structure shown in FIG. 12 in which the insulating layer 30 and the bank layer 50 do not overlap the sealing material 100 as viewed planarly may be applied to the other embodiments and modified examples.

5-5. Fifth Modified Example

Figure 13:
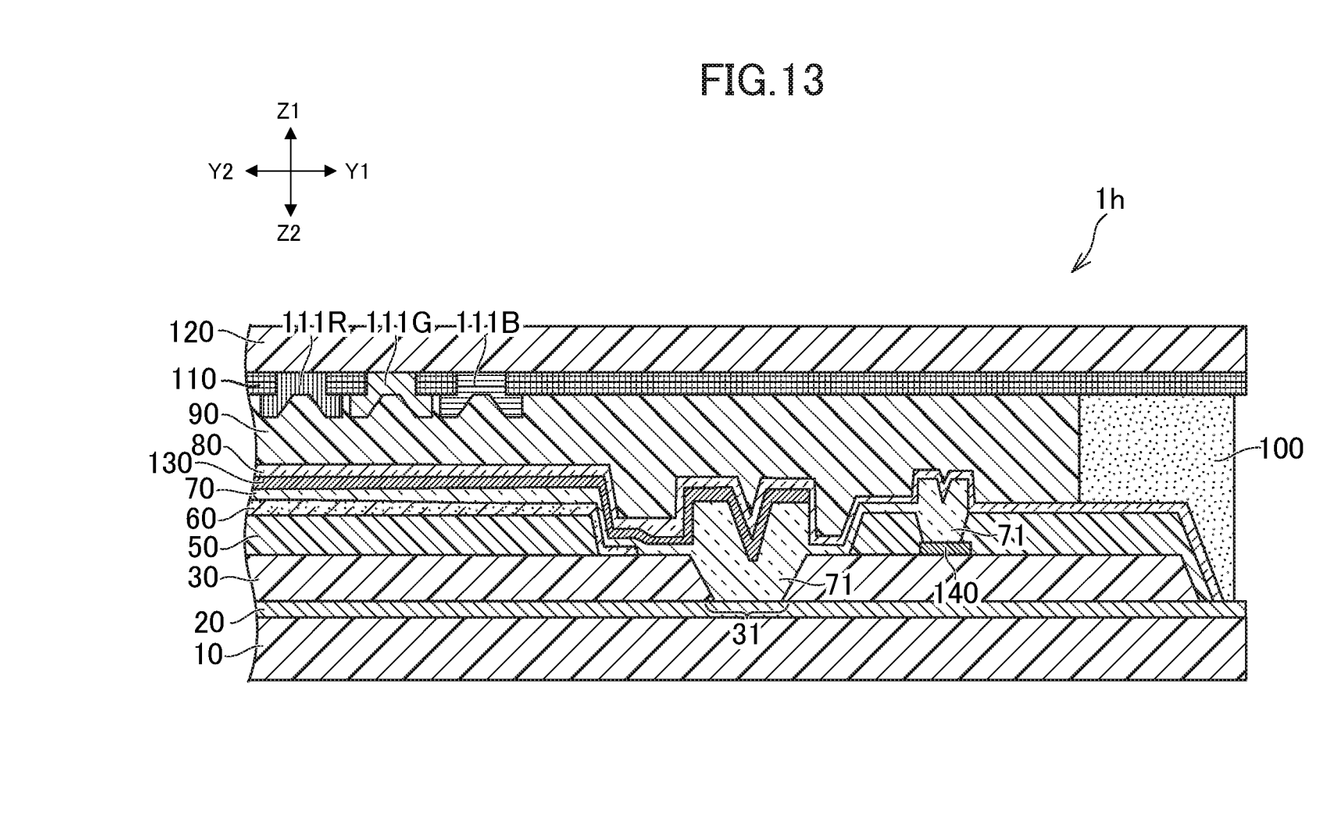
FIG. 13 is a cross-sectional view schematically showing a configuration of a display device according to a fifth modified example.

FIG. 13 is a cross-sectional view schematically showing a display device 1h according to a fifth modified example, corresponding to FIG. 5 in the second embodiment. As shown in FIG. 13, the thick film portion 71 may be formed both inside the groove 31 formed in the insulating layer 30 and on the contact wiring 140. By doing this, it is possible to reduce both the contact resistance between the common electrode 70 and the auxiliary wiring 130 and the contact resistance between the common electrode 70 and the contact wiring 140. That is, the overall sheet resistance of the common electrode 70, the auxiliary wiring 130, and the contact wiring 140 can be reduced, which makes it possible to prevent shading in the display area 3.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
a display area;
a peripheral area located outside the display area;
a plurality of pixels disposed in the display area;
a plurality of pixel electrodes each disposed in each of the plurality of pixels;
a common electrode covering the plurality of pixels and disposed from the display area to the peripheral area continuously;
a light emitting layer disposed between at least one of the pixel electrodes and the common electrode; and
a plurality of auxiliary wirings having conductivity higher than that of the common electrode, electrically connecting to the common electrode, and located from the display area to the peripheral area continuously, wherein
the common electrode includes overlapping areas where the common electrode is in contact with and overlaps the plurality of auxiliary wirings in the peripheral area,
the common electrode includes a thick film portion in at least a portion of the overlapping areas, and
a thickness of the thick film portion is larger than that of an area other than the overlapping areas.

2. The display device according to claim 1, wherein
each of the plurality of auxiliary wirings is formed linearly with both ends located in the peripheral area, and
each of the both ends overlaps the thick film portion.

3. The display device according to claim 1, wherein
the plurality of auxiliary wirings include an auxiliary wiring extending in a first direction and an auxiliary wiring extending in a second direction intersecting the first direction.

4. The display device according to claim 1, wherein
the thick film portion is located in an area which is interleaved the auxiliary wirings next to each other and which is between the overlapping areas, and
the thick film portion is continuously provided in a direction in which the plurality of auxiliary wirings are arranged.

5. The display device according to claim 4, wherein
the thick film portion is provided annularly so as to surround the display area.

6. The display device according to claim 1, wherein
the plurality of auxiliary wirings are electrically connected to each other in the peripheral area.

7. The display device according to claim 6, further comprising, in the peripheral area, a connection wiring overlapping the thick film portion and in contact with the common electrode and the plurality of auxiliary wirings so as to electrically connect to the common electrode and the plurality of auxiliary wirings.

8. The display device according to claim 7, wherein
the connection wiring is provided annularly so as to surround the display area.

9. The display device according to claim 1, further comprising:
an insulating film; and
a metal layer, wherein
the insulating film is stacked on the plurality of pixel electrodes on a side opposite to the light emitting layer and stacked on the thick film portion,
the metal layer is stacked on each of the plurality of pixel electrodes with the insulating film therebetween and stacked on the thick film portion with the insulating film therebetween, and
each of the plurality of pixel electrodes, the insulating film, and the metal layer form a capacitor.

10. The display device according to claim 1, further comprising:
a substrate;

a circuit layer located between the substrate and the pixel electrodes and including a driver circuit; and an insulating layer stacked on the circuit layer, wherein the insulating layer includes, in the peripheral area, a groove resulting from removal of the insulating layer, and the thick film portion is provided in the groove.

11. The display device according to claim 10, wherein the thick film portion is filled in the groove and includes a portion in contact with an upper surface of the insulating layer.

12. The display device according to claim 1, further comprising, in the peripheral area, a contact wiring electrically connecting to the common electrode and the plurality of auxiliary wirings, wherein the thick film portion is disposed on the contact wiring and in contact with the contact wiring.

13. The display device according to claim 10, further comprising, in the peripheral area, a contact wiring electrically connecting to the common electrode and the plurality of auxiliary wirings, wherein the thick film portion is disposed also on the contact wiring, and the thick film portion disposed on the contact wiring is in contact with the contact wiring.

14. The display device according to claim 1, further comprising, in the peripheral area, a contact wiring electrically connecting to the common electrode and the plurality of auxiliary wirings, wherein the plurality of auxiliary wirings are in contact with and electrically connected to the contact wiring, and the common electrode does not overlap, as viewed planarly, an area where the plurality of auxiliary wirings and the contact wiring are in contact with each other.

15. The display device according to claim 13, wherein an area where the contact wiring is in contact with any of the thick film portion and the plurality of auxiliary wirings is located on the display area side of the groove.

16. The display device according to claim 13, wherein an area where the contact wiring is in contact with any of the thick film portion and the plurality of auxiliary wirings is located on the side of the groove opposite to the display area.

17. The display device according to claim 1, wherein the thick film portion includes an upper surface and side surfaces intersecting the upper surface, and each of the plurality of auxiliary wirings extends from the display area to an edge portion of the upper surface on the side opposite to the display area.

18. The display device according to claim 17, wherein each of the plurality of auxiliary wirings is in contact with the side surface on the side opposite to the display area.

* * * * *